(12) United States Patent
Harinck et al.

(10) Patent No.: US 10,968,652 B2
(45) Date of Patent: Apr. 6, 2021

(54) DATA CENTER INFRASTRUCTURE SUPPORT SYSTEM

(71) Applicant: Jonathan Harinck, Highlands Ranch, CO (US)

(72) Inventors: Jonathan Harinck, Highlands Ranch, CO (US); Mark Hohlen, Centennial, CO (US)

(73) Assignee: Jonathan Harinck, Highlands Ranch, CO (US)

( * ) Notice: Subject to any disclaimer, the term of this patent is extended or adjusted under 35 U.S.C. 154(b) by 0 days.

(21) Appl. No.: 16/502,901

(22) Filed: Jul. 3, 2019

(65) Prior Publication Data

US 2020/0056392 A1    Feb. 20, 2020

Related U.S. Application Data

(60) Provisional application No. 62/719,023, filed on Aug. 16, 2018.

(51) Int. Cl.
| | |
|---|---|
| *E04H 5/00* | (2006.01) |
| *A47B 96/14* | (2006.01) |
| *H05K 7/14* | (2006.01) |
| *F16B 7/18* | (2006.01) |

(52) U.S. Cl.
CPC ........... *E04H 5/00* (2013.01); *A47B 96/1408* (2013.01); *H05K 7/1488* (2013.01); *E04H 2005/005* (2013.01); *F16B 7/18* (2013.01)

(58) Field of Classification Search
CPC ... A47B 47/021; A47B 47/0091; A47B 57/30; A47B 57/32; A47B 57/34; E04H 2005/005
See application file for complete search history.

(56) References Cited

U.S. PATENT DOCUMENTS

| | | | | |
|---|---|---|---|---|
| 3,468,430 A | * | 9/1969 | Lawman | F16B 12/30 211/182 |
| 3,846,944 A | * | 11/1974 | Lambert | A47B 47/021 52/236.3 |
| 3,905,483 A | * | 9/1975 | Patrick | G12B 9/10 211/190 |

(Continued)

OTHER PUBLICATIONS

The Scalable Containment System to Support Data Center Infrastructure; Subzero a Senneca Company;V_1-1_Aug. 23, 2018 [retrieved Jul. 1, 2019];Retrieved from the Internet: www.subzeroeng.com.

(Continued)

*Primary Examiner* — Paola Agudelo
(74) *Attorney, Agent, or Firm* — Stetina Brunda Garred & Brucker

(57) ABSTRACT

A fastening system is disclosed for forming modular, reconfigurable, and scalable data center infrastructure support systems which may permit construction of self-supporting multi-story data centers capable of supporting substantial loads without requiring external attachment points to walls, ceilings, or building support columns. It may be seen that data center infrastructure support systems formed from there herein described fastening systems may be capable of supporting substantial loads, even when scaled in the vertical direction to include multiple stories.

20 Claims, 13 Drawing Sheets

(56) References Cited

U.S. PATENT DOCUMENTS

| | | | | |
|---|---|---|---|---|
| 4,261,470 | A * | 4/1981 | Dolan | F16B 12/36 |
| | | | | 108/55.1 |
| 5,012,938 | A * | 5/1991 | King | A47B 47/027 |
| | | | | 211/182 |
| 5,624,045 | A * | 4/1997 | Highsmith | A47B 57/487 |
| | | | | 211/191 |
| 6,032,431 | A * | 3/2000 | Sugiyama | E04B 1/2604 |
| | | | | 52/656.9 |
| 6,974,276 | B2 * | 12/2005 | Kirchner | A47B 57/54 |
| | | | | 403/385 |
| 9,066,585 | B2 * | 6/2015 | Kirby | A47B 47/027 |
| 9,357,681 | B2 | 5/2016 | Ross et al. | |
| 10,299,592 | B2 * | 5/2019 | Goerges | F16B 37/045 |
| 2006/0237378 | A1 * | 10/2006 | Pellegrino | E04H 9/022 |
| | | | | 211/29 |
| 2007/0261356 | A1 * | 11/2007 | Vaughn | E04B 1/24 |
| | | | | 52/655.1 |
| 2016/0095430 | A1 * | 4/2016 | Moyer | A47B 47/0091 |
| | | | | 312/265.4 |
| 2017/0105521 | A1 * | 4/2017 | Iellimo | B65G 1/02 |
| 2017/0290421 | A1 * | 10/2017 | Wood | A47B 47/0091 |

OTHER PUBLICATIONS

Western Pacific Storage Solutions; [retrieved Jul. 31, 2019]; Retrieved from the Internet: www.wpss.com.

Ridg-U-Rak; Pick Modules for Order Fulfillment and Storeage Operations; 2009; [retrieved Jul. 31, 2019]; Retrieved from the Internet: www.ridgurak.com.

* cited by examiner

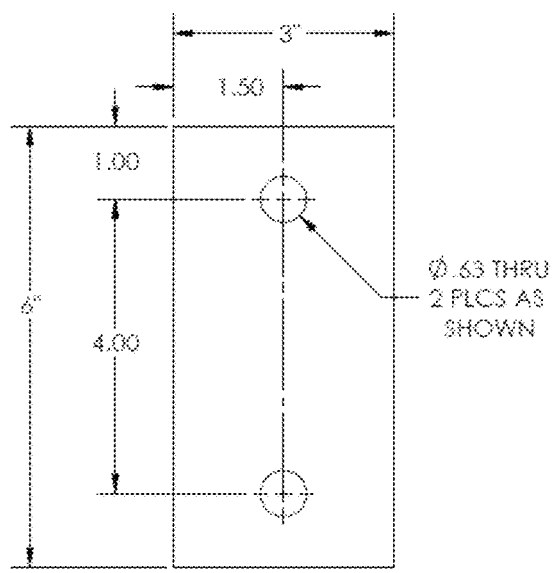
Fig. 5
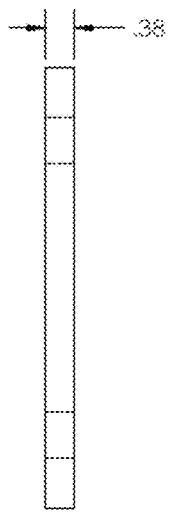
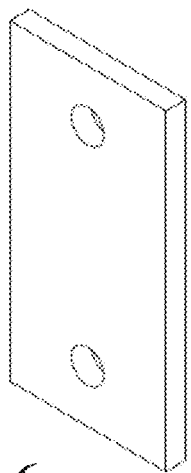
Fig. 6
Fig. 4

DATA CENTER INFRASTRUCTURE SUPPORT SYSTEM

CROSS-REFERENCE TO RELATED APPLICATIONS

This application claims the benefit of U.S. Provisional Application No. 62/719,023, filed Aug. 16, 2018 and entitled DATA CENTER INFRASTRUCTURE SUPPORT SYSTEM, the contents of which are expressly incorporated herein by reference.

STATEMENT RE: FEDERALLY SPONSORED RESEARCH/DEVELOPMENT

Not Applicable

BACKGROUND

1. Technical Field

The present disclosure relates generally to the field of data center infrastructure construction. More particularly, the present disclosure relates to systems for efficiently housing computer systems and methods of constructing such systems.

Conventional data center infrastructure support systems suffer from numerous deficiencies. In today's nimble computing environment, it is often desirable to rapidly scale, reconfigure, or relocate data centers. In many environments where square footage is limited, the most effective way to scale or reconfigure data centers may be vertical scaling via constructing multi-story data centers. However, conventional multi-story data centers typically are not capable of sufficient modularity and scalability, due to the requirements for external attachment points to ceilings, walls, or building support columns in order for the system to be self-supporting without posing dangers. To this end, many conventional multi-story data centers are often constructed as integral with a building, and in many cases, construction of a new conventional data centers may require construction of an entirely new building. In such cases, it might be far more cost-effective to retrofit an existing building to house a new data center than to construct a new building, but this may not be an option with many conventional multi-story data center infrastructure support systems.

There is a need in the art for novel systems for housing computer systems which are modular, scalable, retrofittable and self-supporting even when scaled vertically.

BRIEF SUMMARY

To solve these and other problems, a fastener assembly system for a data center infrastructure support system is contemplated, as well as multi-story data center infrastructure support systems constructed from such fastener assembly systems.

In the exemplary embodiment, a fastener assembly system may comprise a first and second perforated tubing and a connector plate tube. Each perforated tubing may have a square cross section with four sides and being configured with a plurality of perforated tubing apertures along the length of at least two opposed sides, and each perforated tubing aperture may be in linear alignment with a perforated tubing aperture on the opposed side to form a corresponding pair.

The connector plate tube may comprise a tube section having a square cross section with four sides and a plate section, with the plate section being attached at one end of the tube section and comprising two opposed flange portions, and with the tube section having an external side length less than the internal side length of the first section of perforated tubing so as to telescopically receive placement of the first perforated tubing over the end of the tube section not attached to the plate section. The tube section may further have at least one connector plate tube aperture on each of at least two opposed sides of the tube portion, each connector plate tube aperture being in linear alignment with a corresponding connector plate tube aperture on the opposed side of the tube section to form a corresponding pair, such that when the first perforating tubing is telescopically placed over the tube section, each corresponding pair of connector plate tube apertures may be aligned with a corresponding pair of perforating tubing apertures so as to permit placement of linear fastening elements therethrough to secure the first perforated tubing to the connector plate tube.

Each of the at least two opposed flange portions may include least one flange aperture, the flange apertures being sized and configured such that when the plate section of the connector plate tube is placed in alignment against a side of the second perforated tubing, at least two flange apertures align with at least two corresponding pairs of perforated tubing apertures so as to permit placement of linear fastening elements therethrough to secure the connector plate tube to a side of the second perforated tubing.

The first and second perforated tubings may be configured with a plurality of perforated tubing apertures along the length of all four sides. The plurality of perforated tubing apertures on two of the opposed sides of the perforated tubings may be linearly offset along the length of the perforated tubings from the plurality of perforated tubing apertures on the other two opposed sides of the perforated tubings, in order to permit more fine adjustment.

According to certain embodiments, the length of the tube section of the connector plate tube may be from 4 to 12 inches, the width of the of the sides the first and second perforated tubings may be from 9 gauge to 16 gauge, and the width of the sides of the tube section of the connector plate tube may be from 10 gauge to 16 gauge. The linear fastening elements comprises bolts, rivets, or welds.

In an exemplary embodiment, a multi-story data center infrastructure support system may comprise and be constructed from a plurality of the above described perforated tubings and a plurality of the above described connector plate tubes. The multi-story data center infrastructure system may be configured to not require attachments to walls, ceilings, or building support columns, and may be configured to be bolted to a concrete floor. The multi-story system may also be configured to be modular and to permit horizontally or vertically expansion via the addition of further perforated tubings and connector plate tubes.

The multi-story system may be further configured to comprise one or more of: stairways, elevators, material lifts, handrails, fall protection equipment, or kickplates. The multi-story data center infrastructure support may be is configured to include flooring on at least one story. The multi-story date center infrastructure support system may be configured to support live loads of up to 150 lbs. per square foot and static loads of up to 4,500 lbs. per square foot. The multi-story data center infrastructure support system may be configured to further comprise one or more of: fiber, cables, fire sprinklers, fire alarms, lighting, ventilation, cold aisle containment, hot aisle containment, doors, walls, ceiling, HVAC components. The multi-story system may be configured to comprise fire barriers and to have a fire rating, or to follow NFPA 75 and 76, or to follow IBC building codes.

The multi-story system may comprise at least two stories, or may comprise at least three stories.

BRIEF DESCRIPTION OF THE DRAWINGS

These and other features and advantages of the various embodiments disclosed herein are better understood with respect to the following descriptions and drawings, in which:

FIG. 4 is a front schematic view of a connector plate of the embodiment of the fastener assembly illustrated in FIG. 1;

FIG. 5 is a side schematic view of a connector plate of the embodiment of the fastener assembly illustrated in FIG. 1;

FIG. 6 is a perspective schematic view of a connector plate of the embodiment of the fastener assembly illustrated in FIG. 1

DETAILED DESCRIPTION

According to various aspects of the present disclosure, a fastener assembly for a data center support system is contemplated, along with configurations for data center support systems formed via use of the envisioned fastener assembly. According to an exemplary embodiment, the fastener assembly is contemplated as being formed by the junction of two substantially identically formed lengths of perforated tubing with substantially square cross sections and a linear row of spaced apertures aligned across the center of each of the four sides down the length of the tubing. Two sections of tubing are aligned and fastened at a perpendicular angle via placement of a connector plate tube having a tube portion with a square external cross section smaller than the interior cross section of the perforated tubing used, with two apertures on each of two opposing sides of the tube portions, and a connector plate portion at the base of the tube with two protruding flange portions on the other two opposing sides which do not bear the apertures. One of the two lengths of perforated tubing is placed over the tube portion and fastened thereto via placement of bolts across the perforations in opposed sides of the perforated tubing, and through the apertures in the opposed sides of the tube portion, while the connector plate portion is fastened to the side of one of the lengths of perforated tubing via placement and securing of bolts through an aperture in each of the flange portions, into an aperture on one side of the perforated tubing, and out of a corresponding aperture on the opposed side of the perforated tubing. In such a way, it may be seen that construction of a skeleton-like framework for a data center support systems may be rapidly and easily performed, including the creation of multiple-story data center support systems, with such frameworks being easily and rapidly reconfigurable.

This specification and the accompanying figures may include reference to specific dimensions and configurations, and it is should be understood and appreciated that such references are merely exemplary in nature, and are not intended or understood to serve as a limit on the nature of this disclosure in any fashion, including under the doctrine of equivalents.

Figure 1:
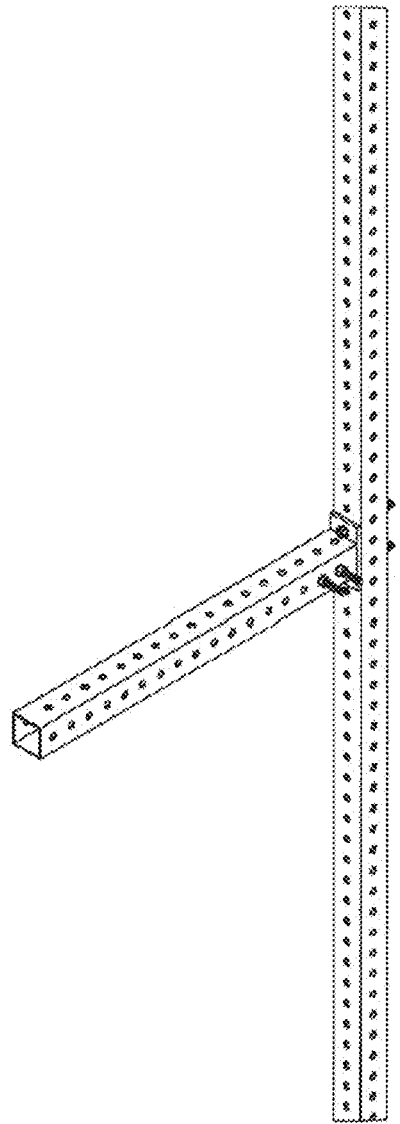
FIG. 1 is a perspective view of an embodiment of a fastener assembly of a data center infrastructure support system.

Turning now to FIG. 1, an embodiment of a fastener assembly of a data center support system is illustrated. As may be seen, fastener assemblies as contemplated herein may permit the rapid fabrication and reconfiguration of lightweight, modular data center support systems.

Figure 2:
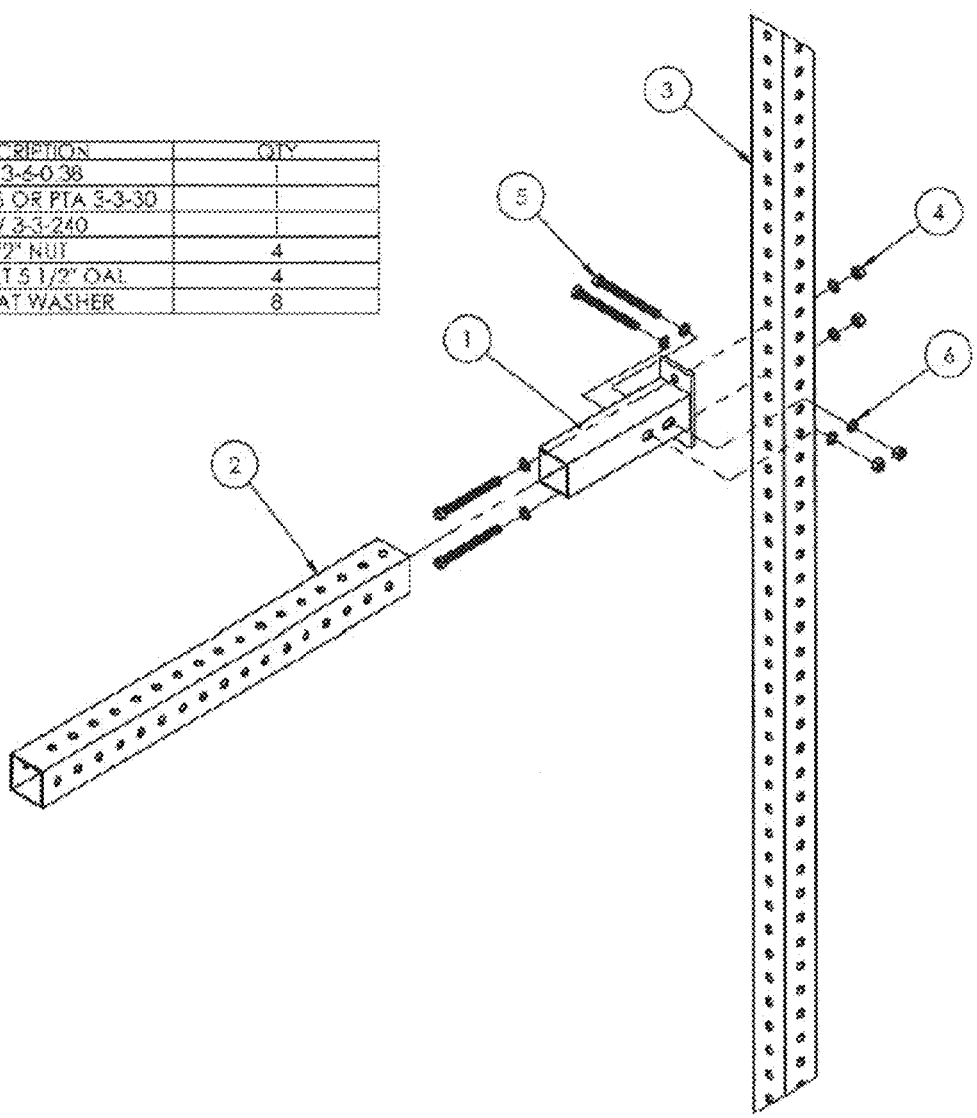
FIG. 2 is an exploded view of the embodiment of the fastener assembly illustrated in FIG. 1.

Turning now to FIG. 2, the individual components of an exemplary fastener assembly are illustrated. As may be seen, an exemplary fastener assembly may join together two lengths of perforated tubing 2 and 3 having square cross sections and open ends arranged in a perpendicular fashion, each of the four sides of each square cross-sectional length of tubing containing a row of linear apertures along the center line and extending across the length of the tubing, with each aperture in alignment with and having the same size and configuration as a corresponding aperture on the opposed side of the square length of tubing. In the exemplary embodiment, the two square lengths of tubing have identical cross-sectional widths, and as such it may be seen that they may be fabricated from the same stock material and merely only are required to be cut to the desired lengths prior to joining. However, it may be seen that in other embodiments, the square lengths of tube may have different cross-sectional widths, or may not have square cross-sections, or may not be entirely linear. It may also be seen that according to further embodiments, the pattern of apertures of the lengths of perforated tubing may differ from that illustrated in the exemplary embodiment, and for example, may comprise a different arrangement of apertures, such as two or more linear rows on each side of the square tubing, or other configurations.

At the interface of the two perforated lengths of tube, a connector plate tube 1 may be interposed between the two square lengths of tubing, permitting the two lengths of tubing to be joined. In the exemplary embodiment, the connector plate tube may comprise a length of non-perforated square tube joined to a connector plate at a base end of the tube, with the length of non-perforated square tube having an outer periphery sized and configured to fit inside an open end of one of the lengths of perforated tubing. It may also be seen, however, that in other embodiments the non-perforated square tube may have an inner periphery sized and configured to accept an external cross section of a length of perforated tubing 2.

In the exemplary embodiment, the connector plate is joined to the connector plate tube via welding. However, it may also be seen that other methods of joining or fastening the connector plate to the connector plate tube may be utilized, including, without limitation, the unitary fabrication of the connector plate and connector plate tube, such as via a single forging or machined product. The connector plate may extend across the entire cross sectional area of the end of the connector plate tube and may further protrude outward from at least two opposed sides of the base of the connector plate tube, resulting in the defining of two flange portions. Each of the flange portions may have one or more flange apertures defined therein, the flange apertures being sized and configured to align with a corresponding aperture on a side of the perforated length of tubing.

Along the side of the connector plate tube 1, and proximal to the base end, there may be two or more connector plate apertures on two opposed sides of the connector plate, the two or more apertures being linearly arranged along the axis of the length of the connector plate tube, with the two opposed sides having the two or more apertures defined therein being the sides from which the connector plate does not extend outward to define a flange portion. In the exemplary embodiment, these apertures have a generally ovoid configuration. However it may be seen that in other embodiments, other configurations may be utilized, without departing from the scope and spirit of the present disclosure.

As may thus be seen, a length of perforated tubing 2 may be placed over a connector plate tube of a connector plate 1, and subsequently fastened to the connector plate tube via the placement and securing of one or more bolts 5, with two bolts being used in the exemplary embodiment. In the exemplary embodiment, a first of these bolts 5 are inserted through, in order, a first apertures of one side of a square length of perforated tubing, a first aperture of one side of the connector plate tube, a first aperture of an opposed side of the connector plate tube, and finally through a first aperture of an opposed side of the square length of perforated tubing. A second bolt is then inserted in a similar fashion through the second aperture of each side of these components, either in the same order or in the opposite order, either of which would result in the placement of two bolts through both components, which may securely fasten the two together once the bolts are tightened in position via the placement of nuts 4, and preferably, with the placement of washers 6 under the heads of the bolts and under the nuts. It may also be seen that other components in addition to bolts may be utilized, and indeed any method of fastening the perforated tubing 2 over the connector plate tube of the connector plate be used, including without limitation, screws, nails, dowels, pegs, ties, welds, rivets, etc., with the illustrated embodiment merely being one preferred embodiment, and not necessarily the only embodiment contemplated.

The connector plate may be placed in abutment against a side of the other length of perforated tubing 3, in alignment such that the two opposed flange portions protrude along its length, with at least one of the one or more aperture in each of the two flange portions placed in alignment with one or more of the apertures on one of the sides of the length of perforated tubing 3. Thus, it may be seen that bolts 5 may be utilized to securely fasten the connector plate of the connector plate tube 1 to the length of perforated tubing 3 by placement of a bolt through an aperture of the flange portion, through a corresponding aperture on one side of the length of tubing 3, subsequently through a corresponding opposed aperture on an opposed side of the length of tubing 3, or in the opposite direction. The bolts 5 may then be secured with a nut 4, optionally with the placement of washers 6 below the head portion of the bolt and under the nuts. Similar to the connection of the tube portion to the length of perforating tubing 2, it is also contemplated that in addition to bolts, other methods of fastening may be utilized, including without limitation, screws, nails, dowels, pegs, ties, welds, rivets, etc., with the illustrated embodiment merely being one preferred embodiment, and not necessarily the only embodiment contemplated.

Figure 3:
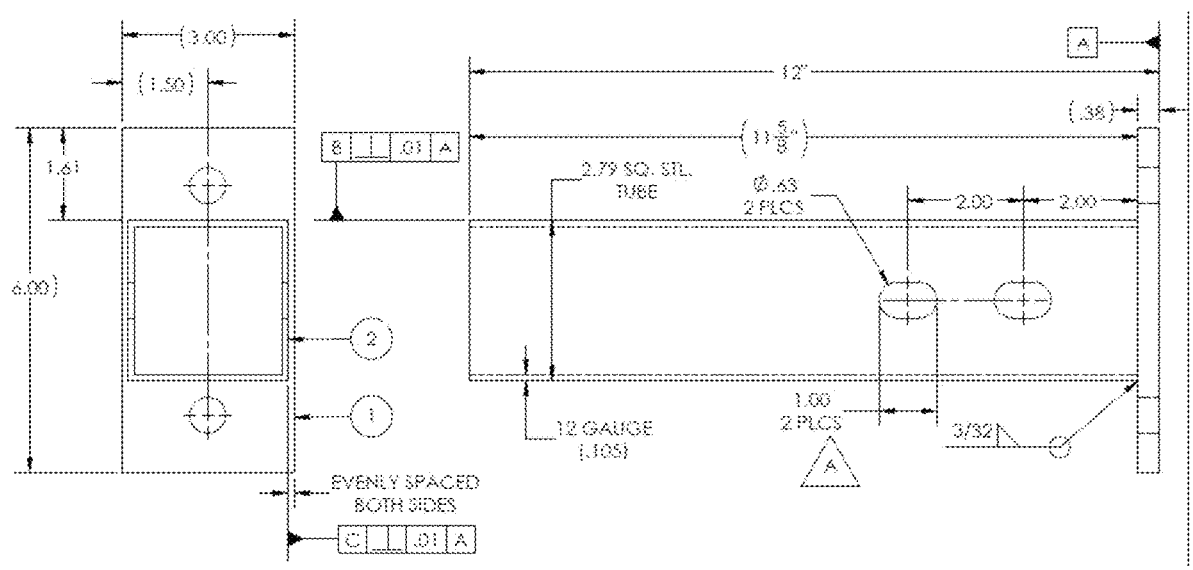
FIG. 3 is a front and side schematic view of a connector plate tube of the embodiment of the fastener assembly illustrated in FIG. 1.

Turning now to FIG. 3, a front and side schematic view of the connector plate tube according to the exemplary embodiment is illustrated. As may be seen, it is envisioned that the apertures of the flange portions of this exemplary embodiment may be substantially circular and sized and configured to receive a bolt therethrough without permitting substantial lateral travel. In contrast, it may be seen that the apertures proximal to the base of the tube portion of the connector plate tube are contemplated, in this exemplary embodiment, as being substantially ovoid, which may permit some lateral travel of a bolt placed therethrough, which may be seen to allow for some variation in the depth of placement or overall alignment of a perforated tube atop the tube portion of the connector plate tube, which may, for example, reduce the level of precision and trimming required in fabrication of lengths of perforated tubing, especially when such lengths of perforated tubing may be cut to a desired length from a preexisting stock material.

Turning now to FIGS. 4, 5, and 6, front, side, and perspective views of a connector plate of a connector plate tube according to the exemplary embodiment are illustrated. As may be seen, in the exemplary embodiment, the connector plate may have a width of 3 inches so as to correspond to a 3 inch external cross section of a length of square-cross sectioned perforated tubing, which preferentially will result in the abutment of the two components without substantial overhang. In contrast, returning to FIG. 3, it may be seen that the tube portion of the connector plate tube may only have an external side length of 2.79 inches, which may permit the placement of square sections of perforated tubing having internal cross sections of greater than 2.79 inches to be placed over such a tube portion. However, it is to be understood that such specific measurements are purely exemplary, and are not intended to limit the scope or spirit of the presently contemplated disclosure.

As will be shown by the following figures, the presently exemplary configuration of FIGS. 1-6 may permit the rapid and modular construction, alteration, and disassembly of a data server infrastructure support system, such as by placement of insulating or other sheeting material over and in between a framework formed by perforated tubing portions attached together via the connector plate tubes as herein described and contemplated.

Figure 7:
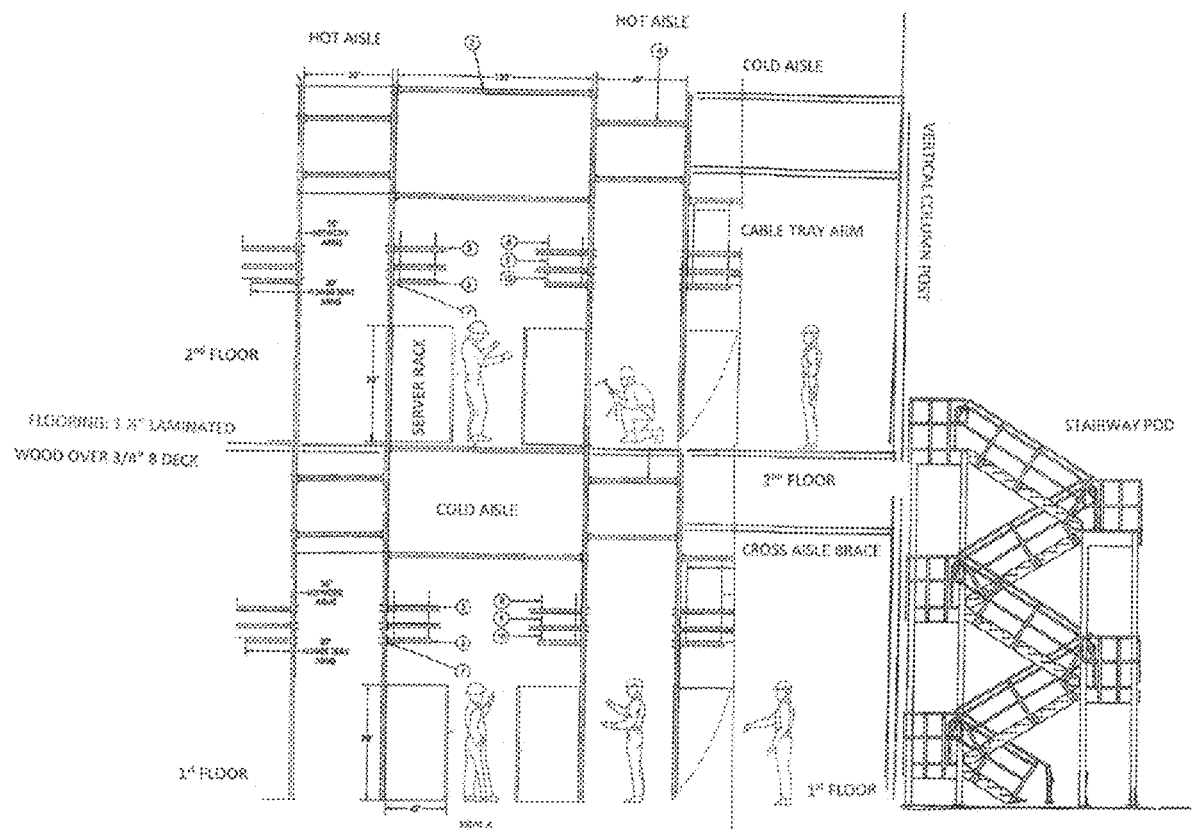
FIG. 7 is a front schematic view of two individual rows of a two story embodiment of a data center infrastructure support system.

Turning now to FIG. 7, a front schematic view of two individual rows of a two story embodiment of a data center infrastructure support system is illustrated, showing four data center modules in the plane of the illustration. It may be seen that there are generally two configurations of modules for a data center infrastructure support system, an external module which may be along the outside of a data center infrastructure support system, and an series of repeating internal modules on the interior of the data structure infrastructure support system.

As may be seen, each modules may comprise a server portion which may accept placement of a two opposed rows of one or more server racks or other data center components placed along each side of the server portion and extending down the length of the server portion (into the page), with a plurality of tray arms protruding horizontally above the server racks and also potentially extending in a row into the page. The tray arms may serve to support and elevate, among other things, networking equipment or components, power equipment or components, cables, or any other components which may be required to be supported. It may also be seen that these tray arms may be optional, and may be configured and reconfigured using the fastener assembly illustrated by FIGS. 1-6, or with other assemblies.

As may also be seen, each server portion may be horizontally divided from the server portion of the next module by the presence of a hot aisle, each repeating module having one hot aisle length extending into the depth of the page. This hot aisle may be configured to accept and carry away the waste heat produced by the operation of the server racks or other data center components placed in the server portion, such as via fans or other systems for promoting airflow. For example, a duct at the top of the hot aisle, as illustrated in the figure, may be fluidly connected to a source for powered air movement, such as a fan or other ventilation system. As the warm air rises from the hot aisle, it may then enter the hot aisle duct where it may be more rapidly conveyed throughout the data center. It may also be seen that the hot airflow from the server portion may dissipate into the hot aisle through apertures on the side walls dividing the hot aisle from the cold aisle, and that such apertures may even include the apertures of the tubing material itself that form the scaffolding, especially if the area between the scaffolding is entirely enclosed, which may permit more speedy construction.

It may additionally be seen that above each server portion, each module may have a ducted cold aisle that extends down the length of the server portion into the depth of the page. The cold aisle may be configured to intake and deliver ventilating cooling airflow to the server portions, such as via placement in fluid communication of each length of cold aisle with a source of cooling or refrigerated airflow. It may be seen that the airflow from the cold aisle may dissipate into the server portions through apertures on the base of the cold aisle, and that such apertures may even include the apertures of the tubing material itself that form the scaffolding, especially if the area between the scaffolding is entirely enclosed, which may permit more speedy construction. It may further be seen that, in such a configuration where the apertures in the perforated tubing material are utilized for the passage of hot airflow from the server portion to the hot aisle and cold airflow to the server portion from the cold aisle, the use of the solid connector plates of the connector plate tube may serve to segregate the interiors of the perforated tubing from an adjacent connected perforating tube, thus resulting in reduced leakage of airflow between the hot aisle and the cold aisle.

At the outside of the external modules, it may be desirable to utilized a different configuration where, instead of a scaffolding construction formed from the illustrated embodiments of FIGS. 1-6, a more solid construction such as a vertical post may be desirable, along with stairways to permit access to upper floors where further rows of modules may be placed. The second floor may be placed above the cold aisle of the first floor of modules, with the modules repeating in a similar fashion. In such a way, it may be seen that the same square footage of land may be utilized to accommodate twice and many server racks or other data center computing components.

Figure 8:
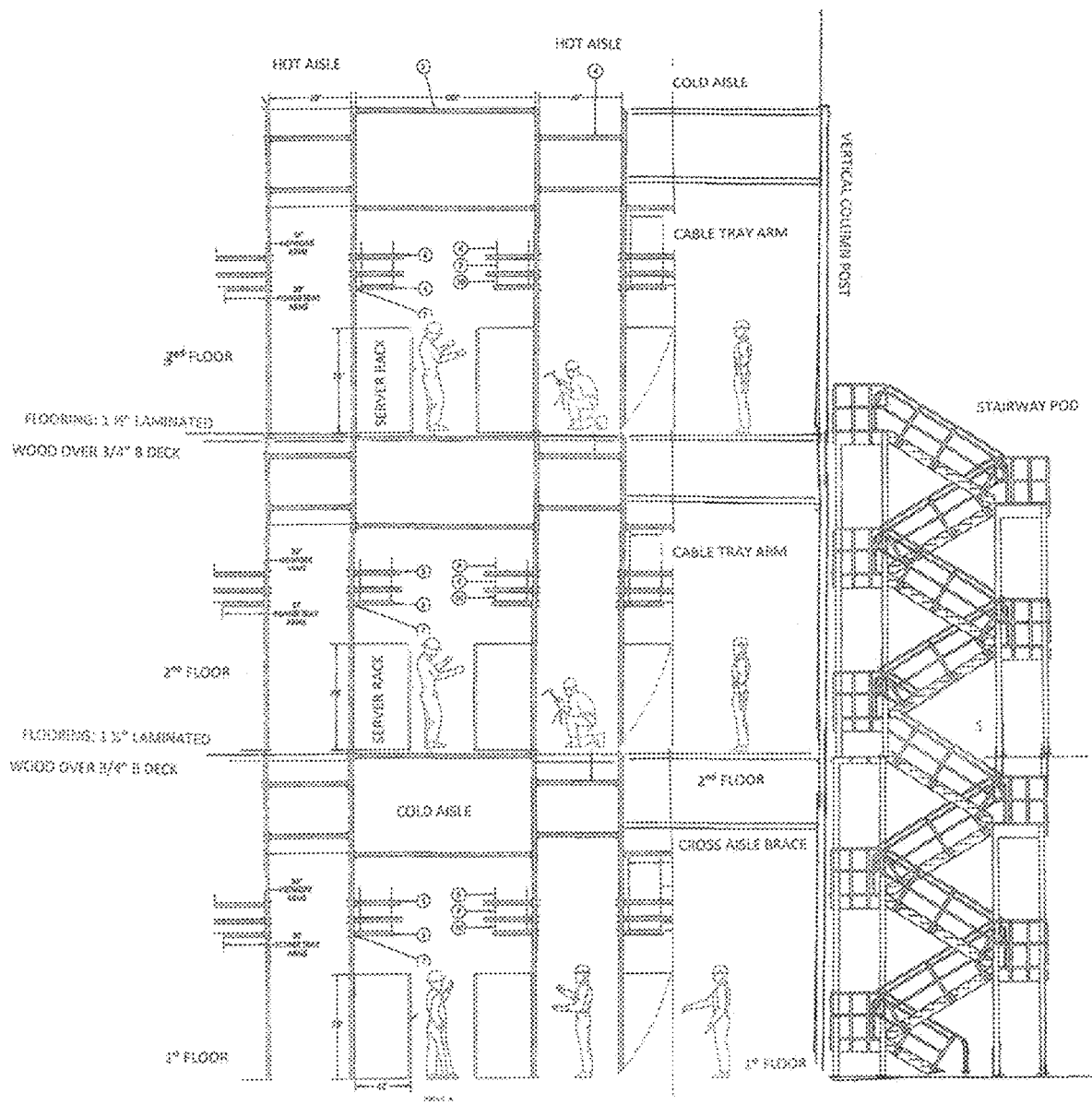
FIG. 8 is a front schematic view of two individual rows of a three story embodiment of a data center infrastructure support system.

Turning now to FIG. 8, a front schematic view of two individual rows of a three story embodiment of a data center infrastructure support system is illustrated. As may be seen, the three story embodiment may not necessarily differ substantially from the two story embodiment, except for the placement of an additional story. It may also be seen that the placement of further additional stories, or portions of additional stories, may be readily achievable according to the modular construction technique using the components herein described.

Figure 9:
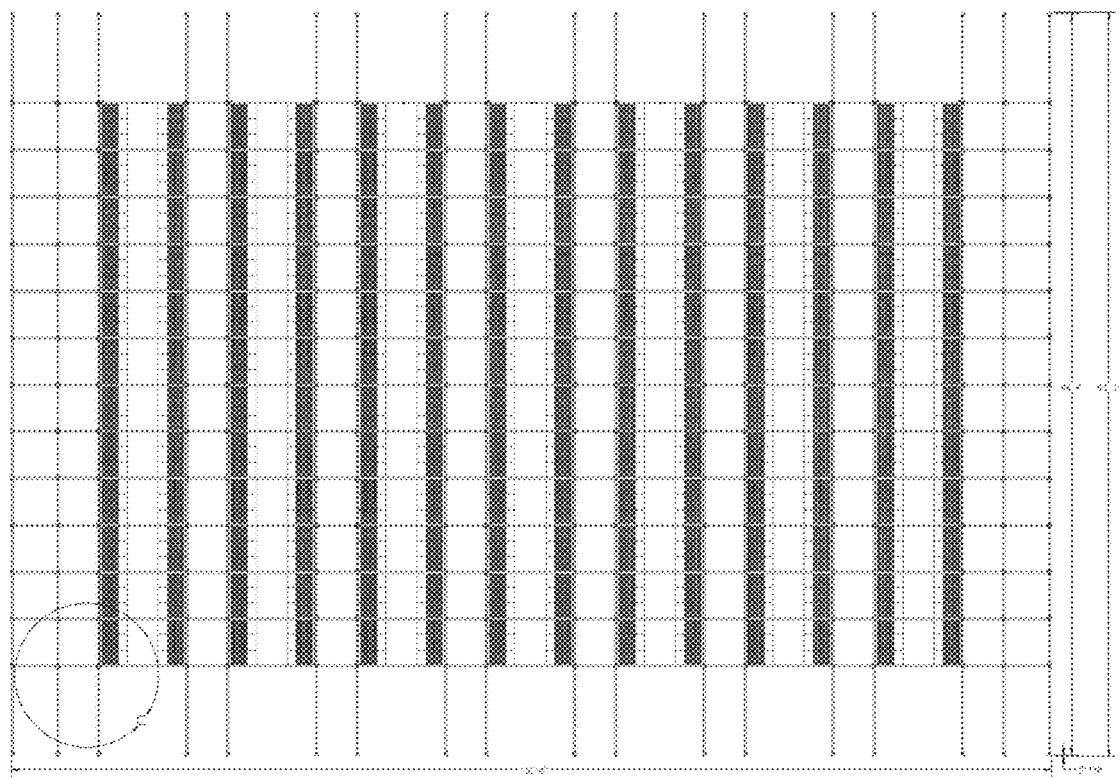
FIG. 9 is a top schematic view of a single story embodiment of a data center infrastructure support system.

Turning now to FIG. 9, a top schematic view of a single story embodiment of a data center infrastructure support system is illustrated, containing 84 modules in a 7-module wide, 12-module deep configuration, with each module having installed therein 6 servers racks for a total of 504 server racks. However, it should be understood that this amount of server racks is arbitrary and not meant to impose a limit on the scope or spirit of the present disclosure, and that it is readily conceivable for more or less modules to be utilized, and for each module to contain more or less servers. As may be seen, according to this illustrated embodiment, both outer sides of the data center infrastructure support system may have an additional outside hot aisle. For example, it may be contemplated that each hot aisle may be ducted and may be arranged in a ribbon-like configuration whereby at the end of each top-to-bottom length of modules, the hot aisle duct curves 180 degrees to be continuous with the next hot aisle over, resulting in a single channel for the passage of heat away from the server portions of the modules for the entire story, or even for multiple stories. Alternatively, it may be seen that each top-to-bottom length may be isolated from the next aisle over. Likewise, it may be see that the cold aisles may be similarly configured in a ribbon-like configuration or as isolated linear systems.

Figure 10:
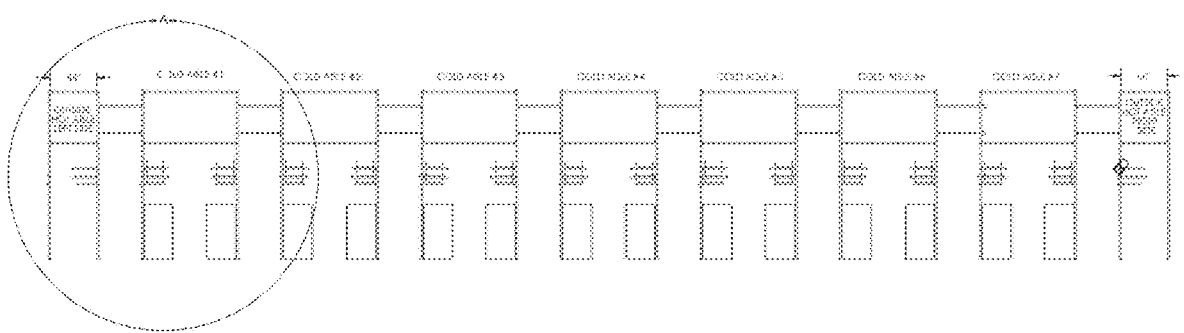
FIG. 10 is a front schematic view of the single story embodiment of the data center infrastructure support system illustrated in FIG. 9.

Turning now to FIG. 10, a front schematic view of the single story embodiment of a data center infrastructure support system of FIG. 9 is illustrated, showing an entire lengthwise row of seven modules.

Figure 11:
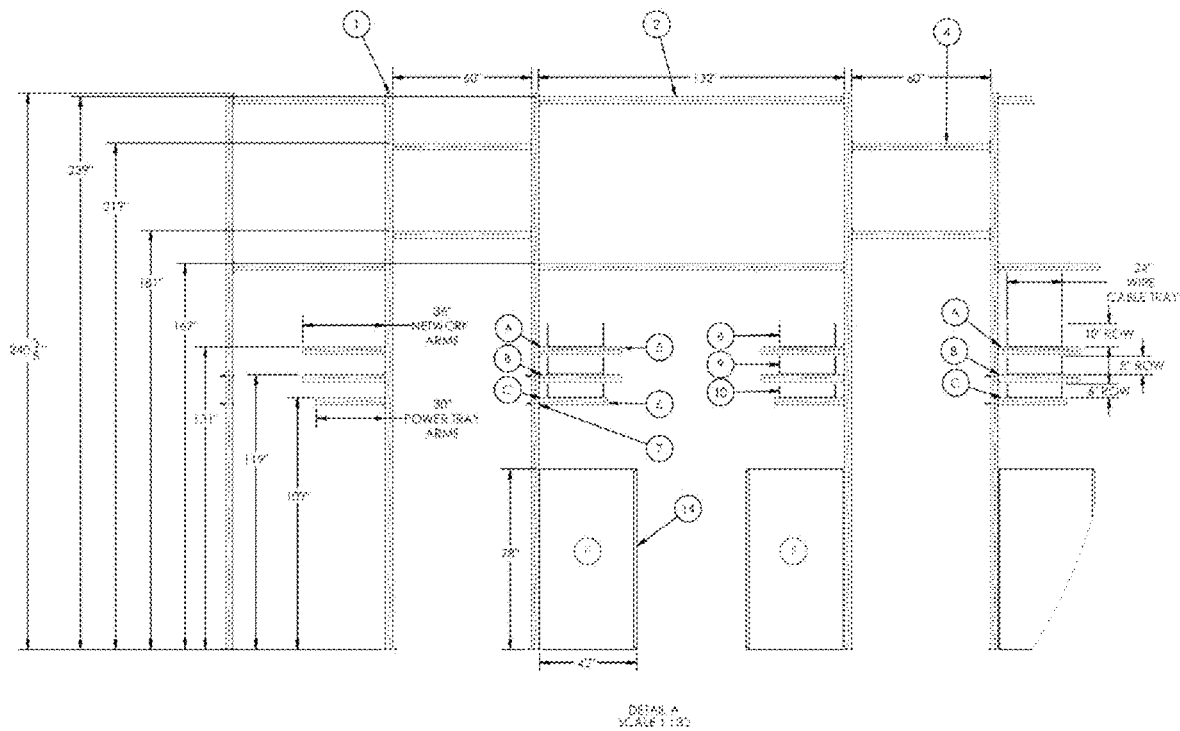
FIG. 11 is a detailed schematic view of the circled portion labeled "A" in FIG. 10.

Turning now to FIG. 11, a detailed schematic view of the circled portion labeled "A" in FIG. 10 is shown, containing specific measurements for an exemplary embodiment of the data center infrastructure support system. It may be seen that such an embodiment may be especially configured for the placement of 42" deep, 78" tall server racks, and with two rows of 36" network arms and one row 30" power tray arm above each row of server racks. It may also be seen that in this embodiment, a 24" space may be allocated above the tray arms for a wire cable tray. However, it is to be understood and appreciated that these measurements are purely for exemplary purposes, and are not to be interpreted as limiting the scope or spirit of the presently disclosed concepts in any fashion. It may be readily conceived that larger or smaller dimensions of all of these components, if utilized at all, may be accommodated, without departing from the inventive scope of the herein disclosed concepts.

Figure 12:
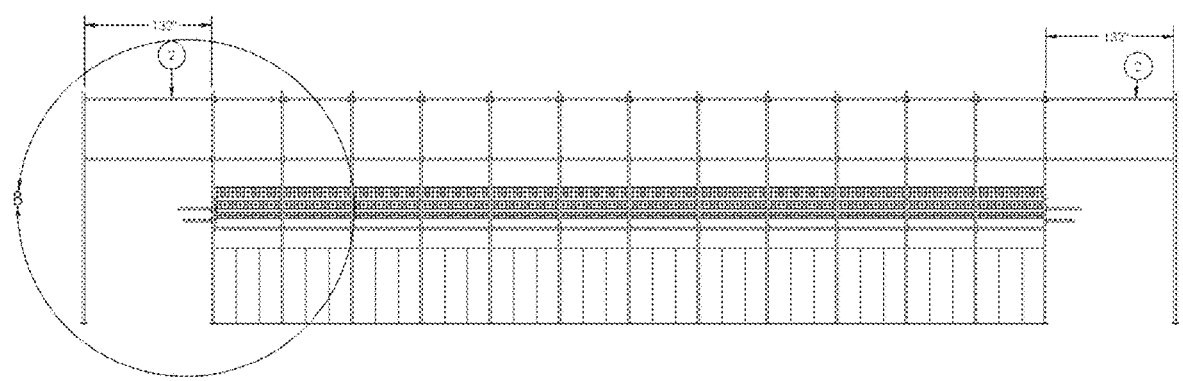
FIG. 12 is a side schematic view of the single story embodiment of the data center infrastructure support system illustrated in FIG. 9.

Turning now to FIG. 12, a side schematic view of the single story embodiment of a data center infrastructure support system of FIG. 9 is illustrated, showing how the installed server racks may be linearly arranged, with the rows of tray arms above them.

Figure 13:
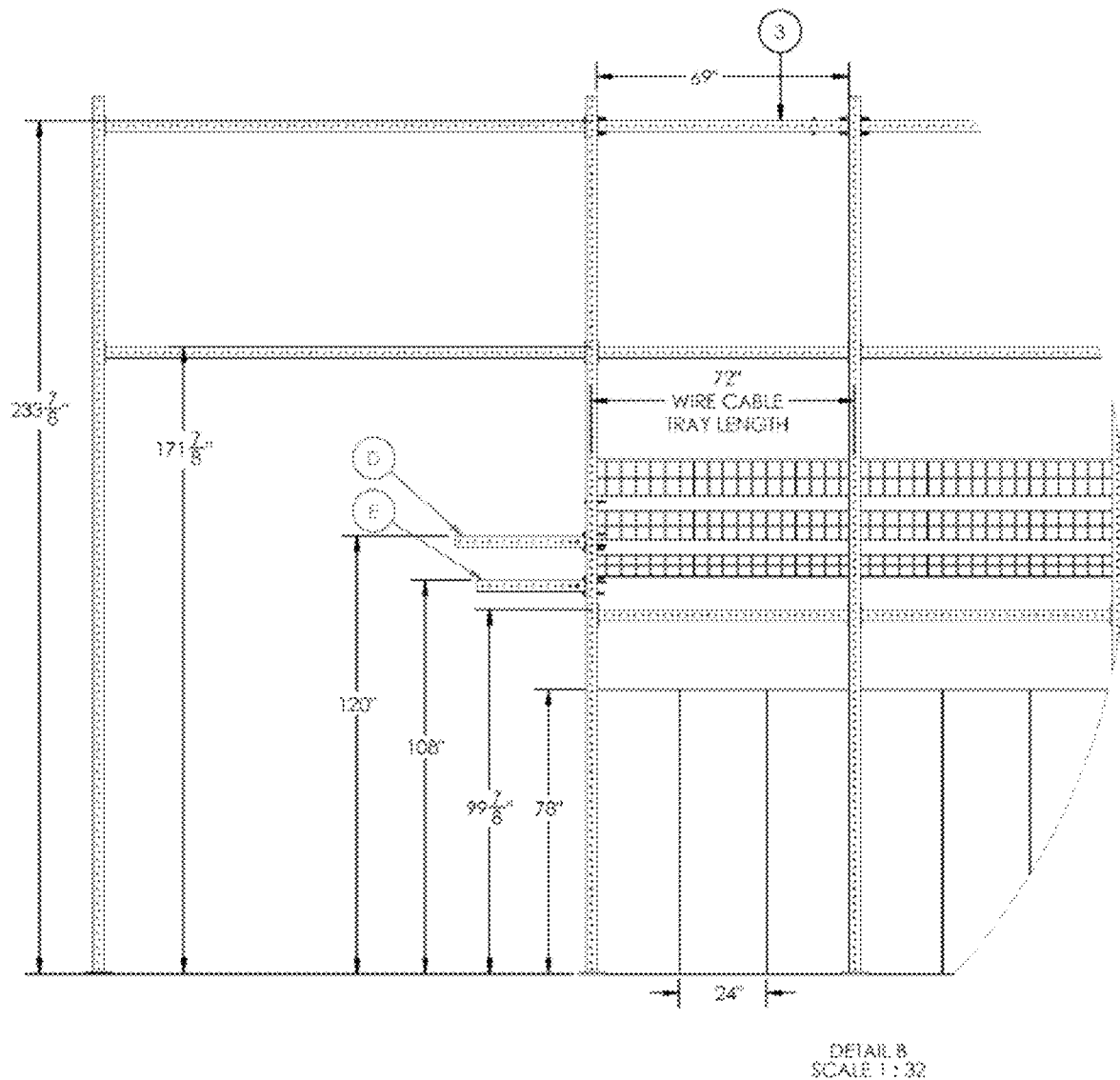
FIG. 13 is a detailed schematic view of the circled portion labeled "B" in FIG. 12.

Turning now to FIG. 13, a detailed schematic view of the circled portion labeled "B" in FIG. 12 is illustrated, containing specific measurements for an exemplary embodiment of the data center infrastructure support system. It may be seen that such an embodiment may be especially configured for the placement of 72" wire cable tray lengths, and that the perimeter aisles may also contain their own tray arms. However, it is to be understood and appreciated that these measurements are purely for exemplary purposes, and are not to be interpreted as limiting the scope or spirit of the presently disclosed concepts in any fashion.

Figure 14:
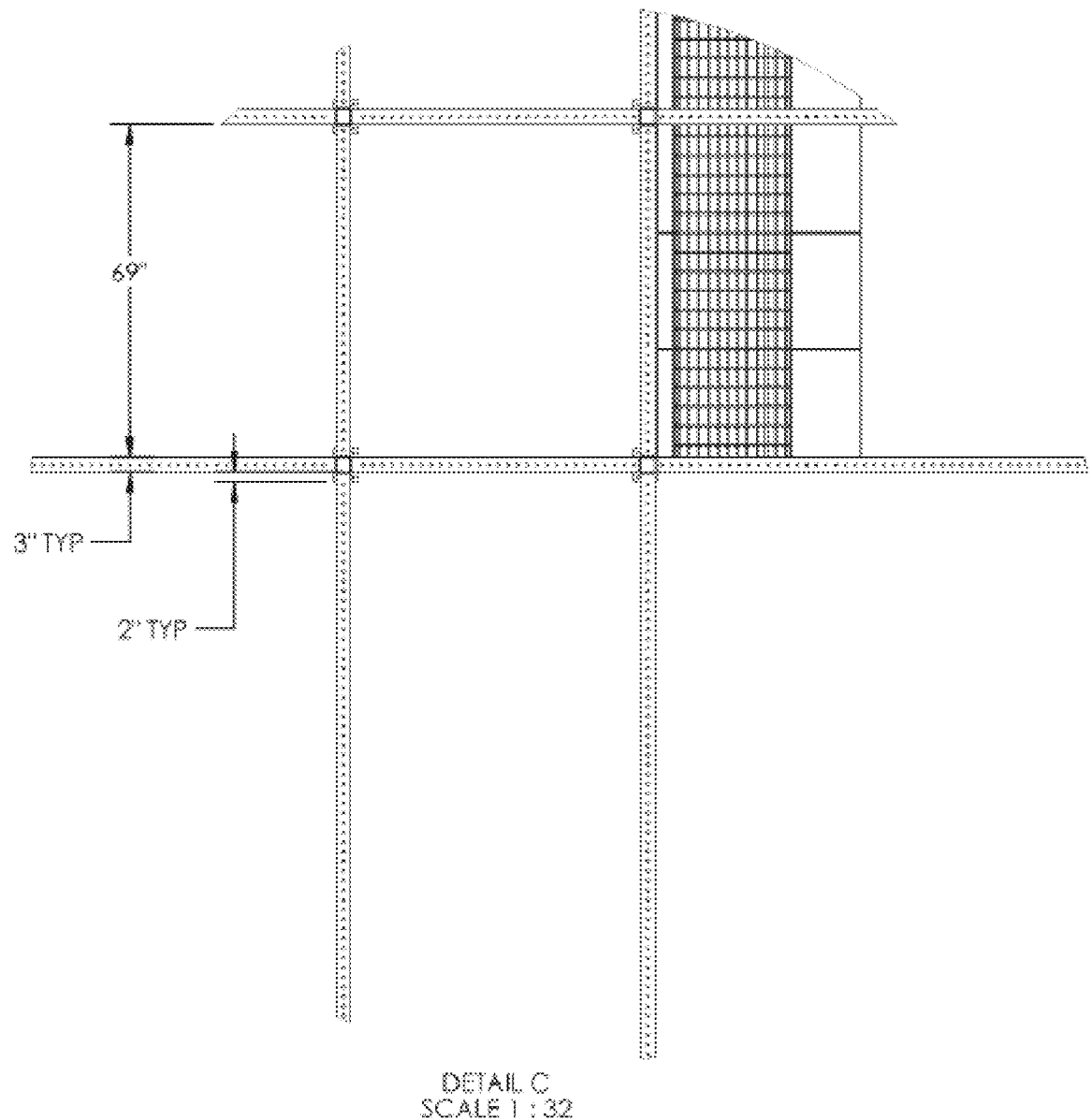
FIG. 14 is a detailed schematic view of the circled portion labeled "C" in FIG. 9.

Turning now to FIG. 14, a detailed schematic view of the circled portion labeled "C" in FIG. 9 is illustrated, containing specific measurements for an exemplary embodiment of the data center infrastructure support system. It is to be understood and appreciated that these measurements are purely for exemplary purposes, and are not to be interpreted as limiting the scope or spirit of the presently disclosed concepts in any fashion.

Figure 15:
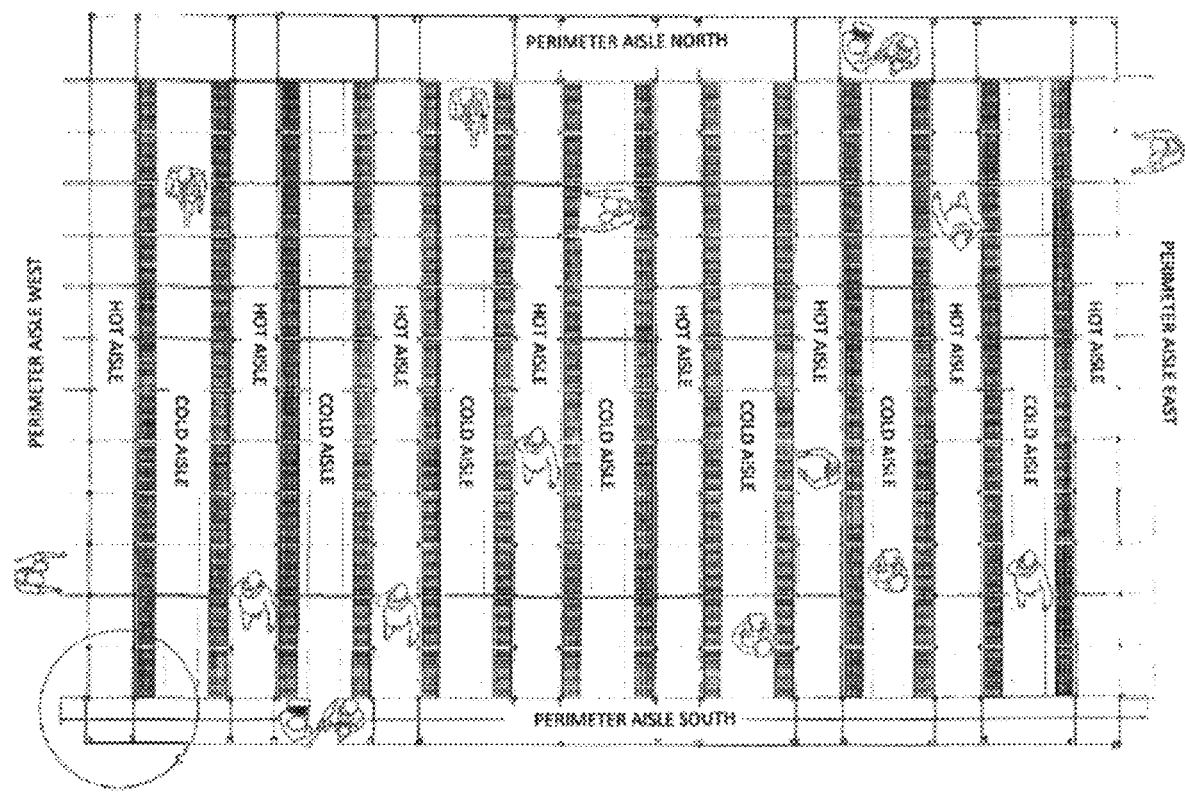
FIG. 15 is a is a top schematic view of a first floor of a multi-floor embodiment of a data center infrastructure support system.
Figure 16:
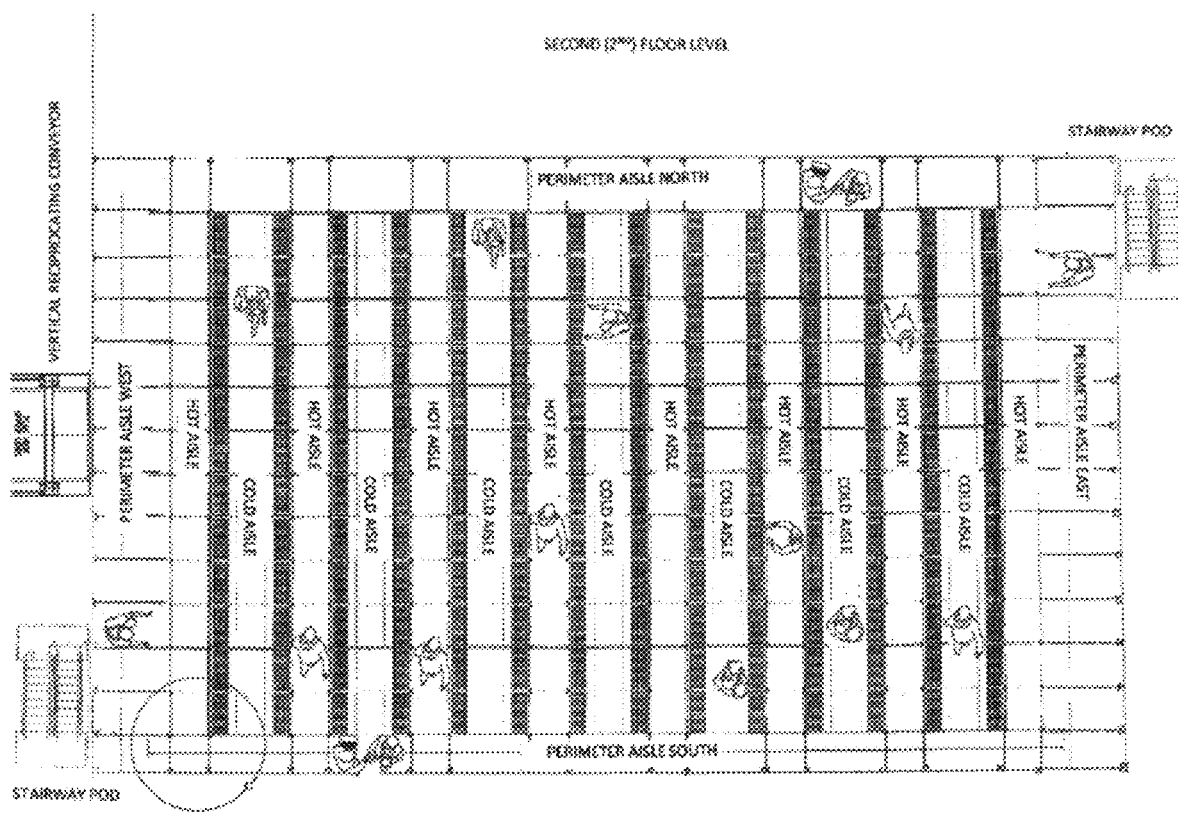
FIG. 16 is a top schematic view of a second floor of a multi-floor embodiment of a data center infrastructure support system.
Figure 17:
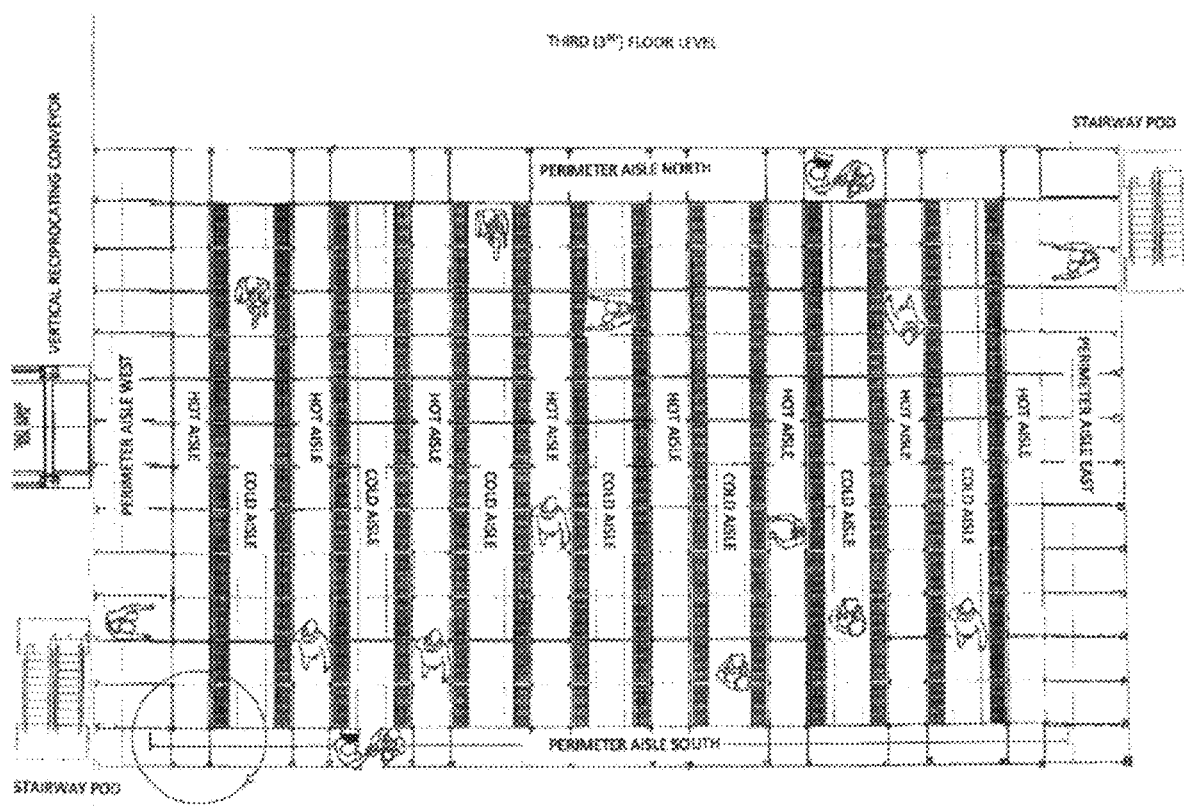
FIG. 17 is a top schematic view of a third floor of a multi-floor embodiment of a data center infrastructure support system.

Turning now to FIGS. 15, 16, and 17, schematics of the first, second, and third floor of an exemplary three-story embodiment of a data center infrastructure support system are shown. It may be seen that, due to the modular construction, a vertically reciprocating conveyer may be utilized to move materials between the levels, and that the placement of stairway pods may permit personnel to transit between the levels.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the exemplary embodiments.

What is claimed is:

1. A fastener assembly system for a data center infrastructure support system, the fastener assembly system comprising:
   a first and second perforated tubing, each perforated tubing having a square cross section with four sides and being configured with a plurality of perforated tubing apertures along the length of at least two opposed sides, each perforated tubing aperture along the length of each side being substantially linearly spaced along the length of each side of perforating tubing at a first distance between adjacent perforated tubing apertures, each perforated tubing aperture being in linear alignment with a perforated tubing aperture on the opposed side to form a corresponding pair;
   a connector plate tube, the connector plate tube comprising a tube section having a square cross section with four sides and a plate section, the plate section being attached at one end of the tube section and comprising two opposed flange portions, the tube section having an external side length less than an internal side length of the first section of perforated tubing so as to telescopically receive placement of the first perforated tubing over the end of the tube section not attached to the plate section, the tube section further having at least one connector plate tube aperture on each of at least two opposed sides of the tube section, each connector plate tube aperture being in linear alignment with a corresponding connector plate tube aperture on the opposed side of the tube section to form a corresponding pair, such that when the first perforating tubing is telescopically placed over the tube section, each corresponding pair of connector plate tube apertures may be aligned with a corresponding pair of perforating tubing apertures so as to permit placement of linear fastening elements therethrough to secure the first perforated tubing to the connector plate tube;
   wherein each of the at least two opposed flange portions include a flange aperture, the flange aperture of one flange portion being substantially spaced from a flange aperture of the opposed flange portion at a positive integer multiple of the first distance, such that when the plate section of the connector plate tube is placed against a side of the second perforated tubing with one flange aperture in alignment with a first corresponding pair of perforated tubing apertures, the flange aperture of the opposed flange portion aligns with a second corresponding pair of perforated tubing apertures so as to permit placement of linear fastening elements therethrough to secure the connector plate tube to a side of the second perforated tubing.

2. The fastener assembly system of claim 1, wherein the first and second perforated tubings are configured with a plurality of perforated tubing apertures along the length of all four sides.

3. The fastener assembly system of claim 2, wherein the plurality of perforated tubing apertures along the length a first side of each perforated tubing are linearly aligned with the plurality of perforated tubing apertures along a length of a second side of that perforated tubing opposed to the first side, wherein the plurality of perforated tubing apertures along the length of a third side of each perforated tubing are linearly aligned with the plurality of perforated tubing apertures along a length of a fourth side of that perforated tubing opposed to the third side, and wherein the plurality of perforated tubing apertures along the first and second side of each perforated tubing are linearly offset along the length of that perforated tubing from the plurality of perforated tubing apertures along the length of the third and fourth side of that perforated tubing.

4. The fastener assembly system of claim 1, wherein the length of the tube section of the connector plate tube is from 4 to 12 inches.

5. The fastener assembly system of claim 1, wherein the width of the sides the first and second perforated tubings are from 9 gauge to 16 gauge.

6. The fastener assembly system of claim 1, wherein the width of the sides of the tube section of the connector plate tube is from 10 gauge to 16 gauge.

7. The fastener assembly system of claim 1, wherein the linear fastening elements comprise bolts.

8. A multi-story data center infrastructure support system, the multi-story data center infrastructure support system comprising:
   a plurality of perforated tubings, each perforated tubing having a square cross section with four sides and being configured with a plurality of perforated tubing apertures along the length of at least two opposed sides, each perforated tubing aperture along the length of each side being linearly spaced along the length of each side of perforating tubing at a first distance between adjacent perforated tubing apertures, each perforated tubing aperture being in linear alignment with a perforated tubing aperture on the opposed side to form a corresponding pair;
   a plurality of connector plate tubes, each respective connector plate tube comprising a tube section having a square cross section with four sides and a plate section, the plate section being attached at one end of the tube section and comprising two opposed flange portions, the tube section having an external side length less than an internal side length of the first section of perforated tubing so as to telescopically receive placement of a perforated tubing over the end of the tube section not attached to the plate section, the tube section further having at least one connector plate tube aperture on each of at least two opposed sides of the tube section, each connector plate tube aperture being in linear alignment with a corresponding connector plate tube aperture on the opposed side of the tube section to form a corresponding pair, such that when the a perforating tubing is telescopically placed over the tube section, each corresponding pair of connector plate tube apertures may be aligned with a corresponding pair of perforating tubing apertures so as to permit placement of linear fastening elements therethrough to secure the first perforated tubing to the connector plate tube;

wherein each of the at least two opposed flange portions of each respective connector plate tubes include a flange aperture, the flange aperture of one flange portion being spaced from a flange aperture of the opposed flange portion at a positive integer multiple of the first distance, such that when the plate section of the connector plate tube is placed in alignment against a side of the second perforated tubing with one flange aperture in alignment with a first corresponding pair of perforated tubing apertures, the flange aperture of the opposed flange portion aligns with a second corresponding pair of perforated tube apertures so as to permit placement of linear fastening elements therethrough to secure the connector plate tube to a side of the second perforated tubing.

9. The multi-story data center infrastructure support system of claim 8, wherein the system is configured to not require attachments to walls, ceilings, or building support columns.

10. The multi-story data center infrastructure support system of claim 8, wherein the system is configured to be bolted to a concrete floor.

11. The multi-story data center infrastructure support system of claim 8, wherein the system is configured to be modular and to permit horizontally or vertically expansion via the addition of further perforated tubings and connector plate tubes.

12. The multi-story data center infrastructure support system of claim 8, wherein the system is configured to further comprise one or more of: stairways, elevators, material lifts, handrails, fall protection equipment, or kickplates.

13. The multi-story data center infrastructure support system of claim 8, wherein the system is configured to include flooring on at least one story.

14. The multi-story date center infrastructure support system of claim 8, wherein the system is configured to support live loads of up to 150 lbs. per square foot and static loads of up to 4,500 lbs. per square foot.

15. The multi-story data center infrastructure support system of claim 8, wherein the system is configured to further comprise one or more of: fiber, cables, fire sprinklers, fire alarms, lighting, ventilation, cold aisle containment, hot aisle containment, doors, walls, ceiling, HVAC components.

16. The multi-story data center infrastructure support system of claim 8, wherein the system is configured to follow NFPA 75 and 76.

17. The multi-story data center infrastructure support system of claim 8, wherein the system comprises fire barriers and has a fire rating.

18. The multi-story data center infrastructure support system of claim 8, wherein the system is configured to follow IBC building codes.

19. The multi-story data center infrastructure support system of claim 8, wherein the system comprises at least two stories.

20. The multi-story data center infrastructure support system of claim 8, wherein the system comprises at least three stories.

* * * * *